United States Patent
Cho

(10) Patent No.: US 11,574,943 B2
(45) Date of Patent: Feb. 7, 2023

(54) SEMICONDUCTOR PACKAGE

(71) Applicant: SAMSUNG ELECTRONICS CO., LTD., Suwon-si (KR)

(72) Inventor: Kyongsoon Cho, Incheon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 198 days.

(21) Appl. No.: 16/996,058

(22) Filed: Aug. 18, 2020

(65) Prior Publication Data
US 2021/0193717 A1 Jun. 24, 2021

(30) Foreign Application Priority Data

Dec. 20, 2019 (KR) .................. 10-2019-0172320

(51) Int. Cl.
*H01L 27/146* (2006.01)

(52) U.S. Cl.
CPC .. *H01L 27/14618* (2013.01); *H01L 27/14621* (2013.01); *H01L 27/14627* (2013.01); *H01L 27/14634* (2013.01); *H01L 27/14636* (2013.01); *H01L 27/14645* (2013.01); *H01L 27/14683* (2013.01)

(58) Field of Classification Search
CPC ......... H01L 27/14618; H01L 27/14634; H01L 25/167
See application file for complete search history.

(56) References Cited

U.S. PATENT DOCUMENTS

| | | |
|---|---|---|
| 6,777,767 B2 | 8/2004 | Badehi |
| 7,598,580 B1 | 10/2009 | Hsin et al. |
| 8,269,300 B2 | 9/2012 | Chien et al. |
| 8,390,087 B2 | 3/2013 | Tu et al. |
| 8,823,007 B2 | 9/2014 | Yang |
| 8,969,120 B2 | 3/2015 | Huang et al. |
| 9,102,007 B2 | 8/2015 | Hosseini |
| 9,150,406 B2 | 10/2015 | Yang |
| 9,178,970 B2 | 11/2015 | Lynch |
| 9,231,012 B2 | 1/2016 | Weng et al. |

(Continued)

FOREIGN PATENT DOCUMENTS

| | | |
|---|---|---|
| CN | 101103441 A | 1/2008 |
| CN | 101133477 A | 2/2008 |

(Continued)

*Primary Examiner* — Tucker J Wright
(74) *Attorney, Agent, or Firm* — Sughrue Mion, PLLC

(57) ABSTRACT

A semiconductor package is provided. The package includes a semiconductor chip that includes photoelectric conversion elements provided on an active array region of the semiconductor chip; a transparent member on the semiconductor chip; and a spacer between the semiconductor chip and the transparent member, and horizontally spaced apart from the active array region. The spacer includes: a supporter that extends from a top surface of the semiconductor chip toward a bottom surface of the transparent member; a first adhesive pattern that is between the semiconductor chip and a bottom surface of the supporter; and a second adhesive pattern that is between the transparent member a top surface of the supporter. The spacer protrudes from a lateral surface of the semiconductor chip, and a lateral surface of the spacer is offset from the lateral surface of the semiconductor chip.

20 Claims, 18 Drawing Sheets

(56) References Cited

U.S. PATENT DOCUMENTS

| | | |
|---|---|---|
| 9,440,846 B2 | 9/2016 | Yang |
| 9,450,004 B2 | 9/2016 | Tu et al. |
| 10,009,523 B2 | 6/2018 | Park et al. |
| 2007/0048448 A1 | 3/2007 | Kim et al. |
| 2009/0053850 A1 | 2/2009 | Nishida et al. |
| 2009/0121300 A1 | 5/2009 | Voelz |
| 2013/0056844 A1* | 3/2013 | Oganesian ............. H01L 24/73 |
| | | 438/66 |
| 2013/0161702 A1 | 6/2013 | Chen |
| 2015/0060956 A1 | 3/2015 | Chen |
| 2018/0019274 A1* | 1/2018 | Yang ................ H01L 27/14618 |
| 2018/0175101 A1 | 6/2018 | Ho et al. |
| 2018/0286902 A1 | 10/2018 | Hokari et al. |
| 2019/0214423 A1* | 7/2019 | Kim .................. H01L 27/14634 |
| 2020/0321375 A1* | 10/2020 | Wu .................... H01L 27/1469 |

FOREIGN PATENT DOCUMENTS

| | | |
|---|---|---|
| CN | 102004903 A | 4/2011 |
| CN | 104339081 A | 2/2015 |

* cited by examiner

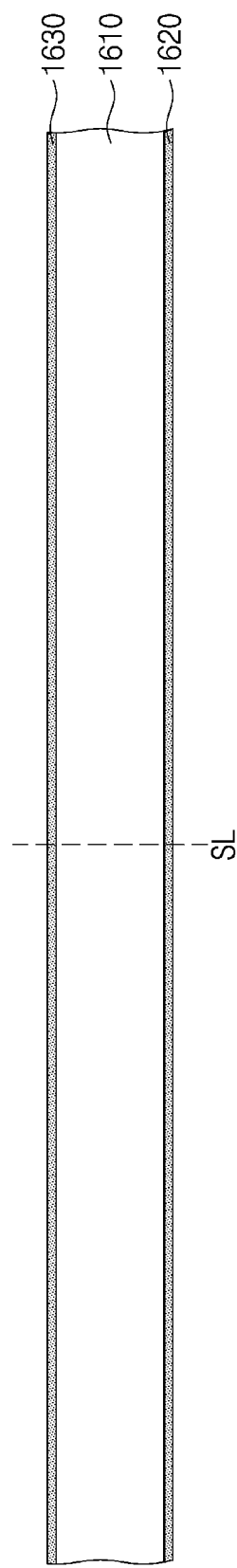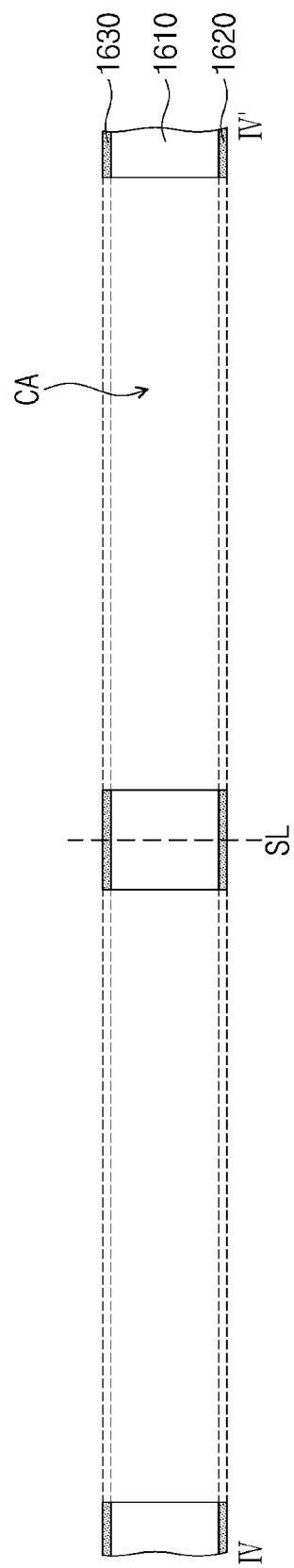

SEMICONDUCTOR PACKAGE

CROSS-REFERENCE TO THE RELATED APPLICATION

This application claims priority from Korean Patent Application No. 10-2019-0172320 filed on Dec. 20, 2019 in the Korean Intellectual Property Office, the disclosure of which is hereby incorporated by reference in its entirety.

BACKGROUND

1. Field

Apparatuses and methods consistent with example embodiments relate to a semiconductor package, and more particularly, to a semiconductor package including a complementary metal oxide semiconductor (CMOS) image sensor.

2. Related Art

An image sensor is a semiconductor device that converts optical images into electrical signals. The image sensor may be broadly classified as a charge coupled device (CCD) type image sensor and a complementary metal oxide semiconductor (CMOS) type image sensor (also referred to as CIS). The image sensor is used for cameras, camcorders, multimedia personal computers, and surveillance cameras, and its usage has dramatically increased.

Reliability of electronic devices is increasingly important. Therefore, there is a need for an image sensor with improved structural stability and improved sensitivity.

SUMMARY

One or more example embodiments provide a semiconductor package with improved structural stability.

One or more example embodiments provide a semiconductor package with increased sensitivity.

Example embodiments are not limited to the mentioned above, and other objects which have not been mentioned above will be clearly understood to those skilled in the art from the following description.

According to an aspect of an example embodiment, there is provided a semiconductor package. The semiconductor package includes: a semiconductor chip that includes a plurality of photoelectric conversion elements provided on an active array region of the semiconductor chip; a transparent member on the semiconductor chip; and a spacer between the semiconductor chip and the transparent member, and horizontally spaced apart from the active array region. The spacer includes: a supporter that extends from a top surface of the semiconductor chip toward a bottom surface of the transparent member; a first adhesive pattern that is between the semiconductor chip and a bottom surface of the supporter; and a second adhesive pattern that is between the transparent member a top surface of the supporter. The spacer protrudes outwardly from a lateral surface of the semiconductor chip, and a lateral surface of the spacer is offset from the lateral surface of the semiconductor chip.

According to an aspect of an example embodiment, there is provided a semiconductor package. The semiconductor package includes: a semiconductor chip that includes a plurality of photoelectric conversion elements provided on an active array region of the semiconductor chip; a transparent member on the semiconductor chip; and a spacer between the semiconductor chip and the transparent member, and horizontally spaced apart from the active array region. The spacer includes: a supporter that extends from a top surface of the semiconductor chip toward a bottom surface of the transparent member; and an adhesive layer on a lateral surface of the supporter. A first end of the adhesive layer extends from the lateral surface of the supporter to contact a lateral surface of the semiconductor chip, a second end of the adhesive layer contacts the bottom surface of the transparent member, the second end being opposite to the first end, and the spacer protrudes outwardly from the lateral surface of the semiconductor chip, and a lateral surface of the spacer is offset from the lateral surface of the semiconductor chip.

According to an aspect of an example embodiment there is provided a semiconductor package that includes: a first semiconductor chip; a second semiconductor chip on the first semiconductor chip, the second semiconductor chip including a through electrode and a plurality of photoelectric conversion elements; a plurality of color filters on a top surface of the second semiconductor chip and arranged to correspond to the plurality of photoelectric conversion elements; a plurality of micro-lenses on the color filters; a transparent member spaced apart from the top surface of the second semiconductor chip; and a spacer that connects the second semiconductor chip to the transparent member. The spacer includes: a supporter along an outer edge of the second semiconductor chip, the supporter surrounding the plurality of micro-lenses; a first adhesive pattern between the supporter and the second semiconductor chip; and a second adhesive pattern between the supporter and the transparent member. A lateral surface of the spacer is spaced apart from a lateral surface of the second semiconductor chip, and a modulus of the supporter is greater than a modulus of the second semiconductor chip.

BRIEF DESCRIPTION OF THE DRAWINGS

FIGS. 10 to 15 illustrate diagrams showing a method of fabricating a semiconductor package according to some example embodiments.

DETAILED DESCRIPTION

The above and other aspects and features will become more apparent by describing in detail example embodiments with reference to the accompanying drawings. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Figure 1:
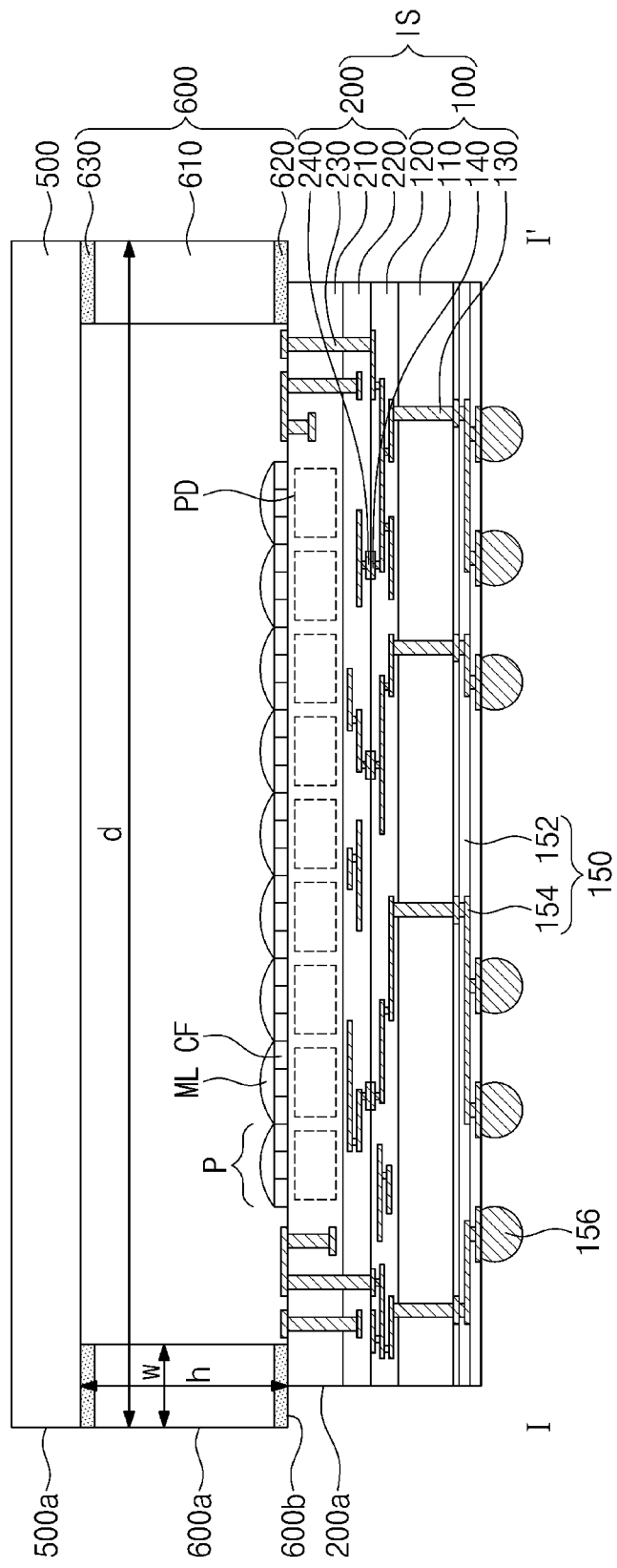
FIGS. 1 and 2 illustrate cross-sectional views showing a semiconductor package according to some example embodiments.
Figure 2:
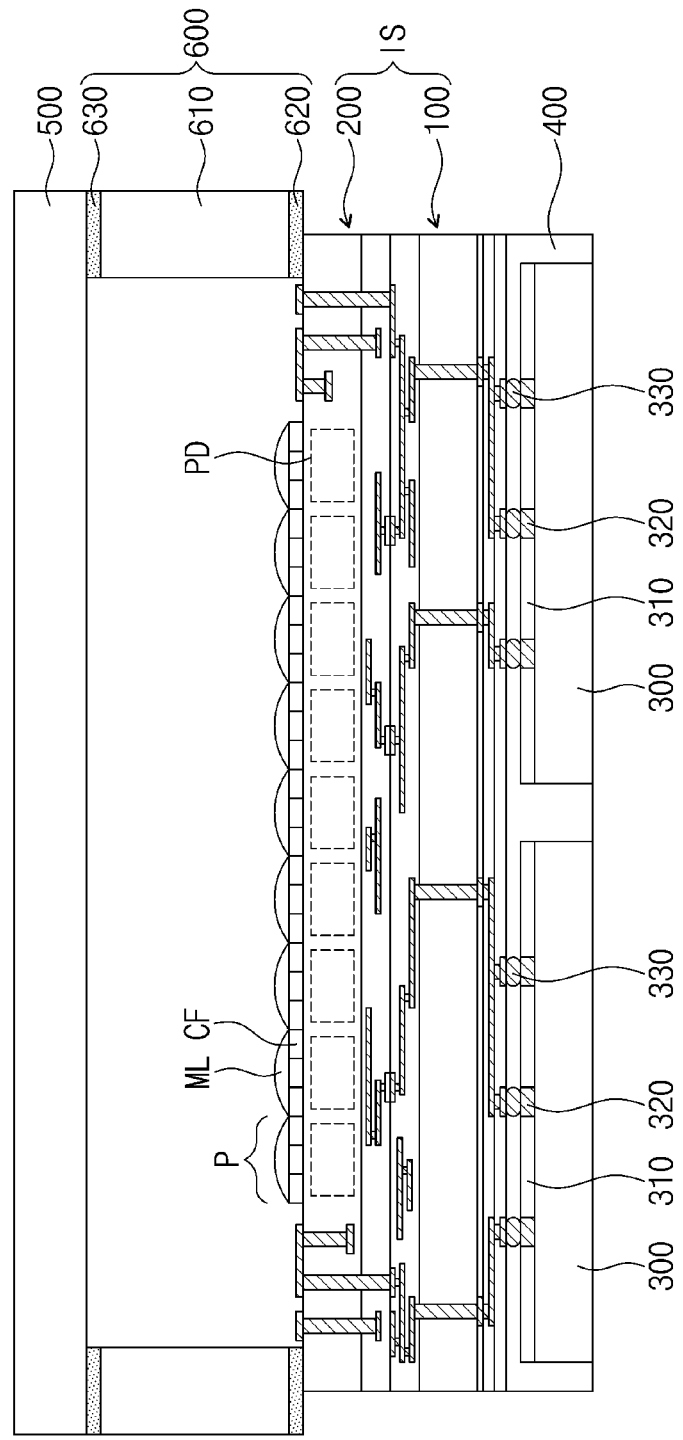
Figure 3:
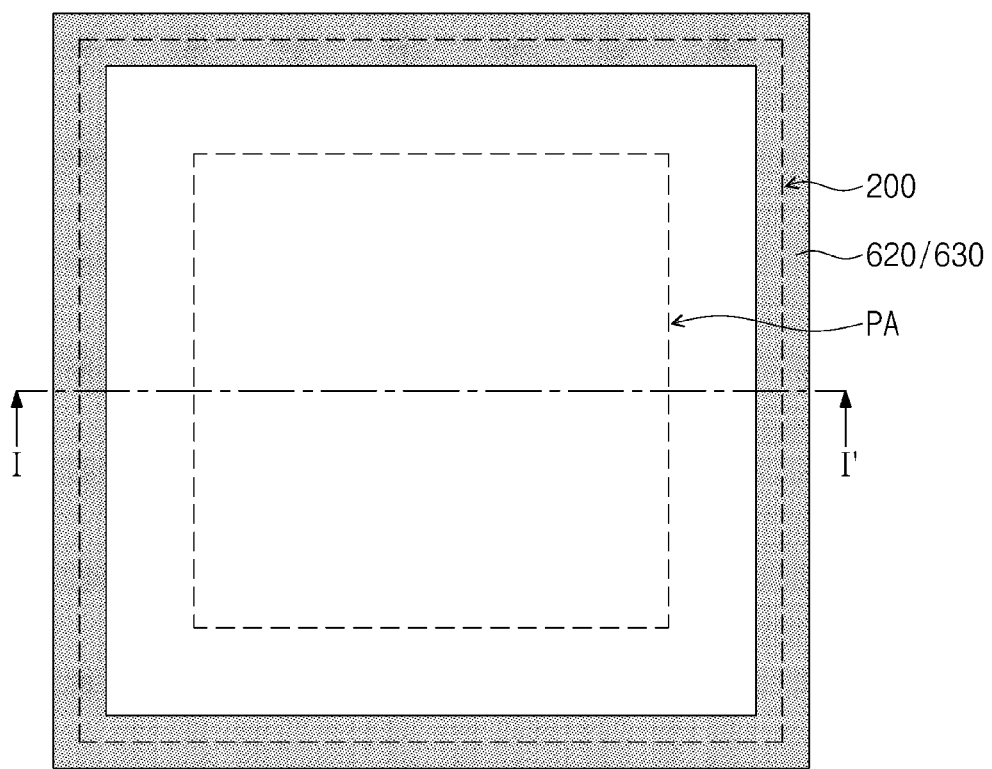
FIG. 3 illustrates a plan view showing a semiconductor package according to some example embodiments.
Figure 4:
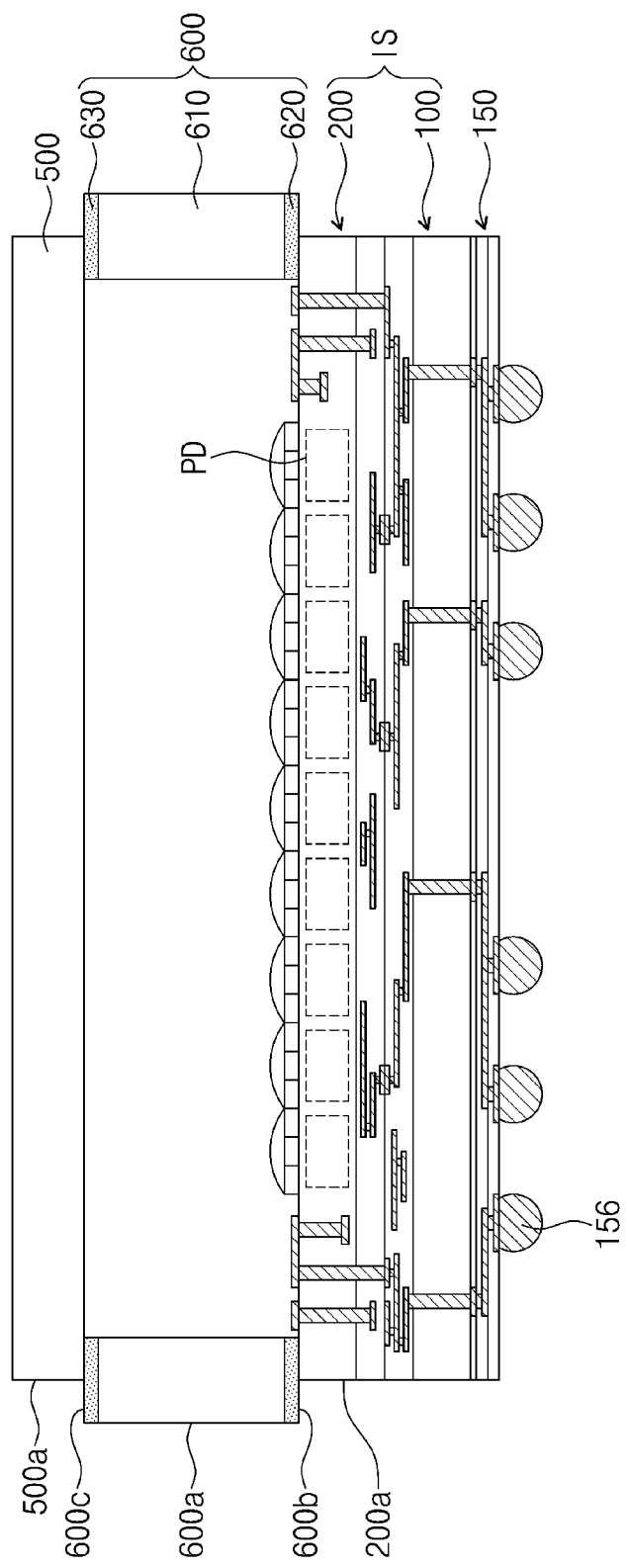
FIGS. 4 and 5 illustrate cross-sectional views showing a semiconductor package according to some example embodiments.

FIGS. 1 and 2 illustrate cross-sectional views showing a semiconductor package according to some example embodiments. FIG. 3 illustrates a plan view showing a semiconductor package according to some example embodiments, and FIG. 1 corresponds to a cross-section taken along line I-I' of FIG. 3. FIG. 4 illustrates a cross-sectional view showing a semiconductor package according to some example embodiments.

Referring to FIGS. 1 and 3, an image sensor part IS may include a first semiconductor chip 100 and a second semiconductor chip 200. The second semiconductor chip 200 may be a sensing chip. For example, the second semiconductor chip 200 may include a photodiode that detects light. The first semiconductor chip 100 may include a logic chip that converts the light detected by the second semiconductor chip 200 into an electrical signal.

The first semiconductor chip 100 may be disposed below the second semiconductor chip 200. The first semiconductor chip 100 may include a first semiconductor layer 110, a first circuit layer 120, a first via 130, and a first bonding pad 140. The first semiconductor layer 110 may include a semiconductor material, for example, silicon (Si), silicon germanium (SiGe), or impurity-doped semiconductor. The first semiconductor layer 110 may be provided therein with integrated circuits. For example, the integrated circuits may be logic devices. The first circuit layer 120 may be provided on the first semiconductor layer 110. The first circuit layer 120 may include a wiring pattern. The first circuit layer 120 may be electrically connected to the integrated circuits in the first semiconductor layer 110. The first via 130 may penetrate the first semiconductor layer 110 and have electrical connection with the first circuit layer 120. In this description, the phrase "electrically connected/coupled to" may include "directly or indirectly electrically connected/coupled to." The first bonding pad 140 may be disposed on a top surface of the first semiconductor chip 100. For example, the top surface of the first semiconductor chip 100 may be an active surface. The first circuit layer 120, the first via 130, and the first bonding pad 140 may include a metallic material, such as copper (Cu), aluminum (Al), nickel (Ni), or tungsten (W).

A redistribution layer 150 may be provided below the first semiconductor chip 100. The redistribution layer 150 may include dielectric layers 152 and a redistribution pattern 154. The redistribution pattern 154 may include a conductive layer and conductive vias. The redistribution pattern 154 may be electrically connected to the first semiconductor chip 100. Portions of the redistribution pattern 154 may be exposed on surfaces of the dielectric layers 152, thereby serving as pads on which external terminals 156 are disposed.

The external terminals 156 may be provided on a bottom surface of the redistribution layer 150. The external terminals 156 may each have a solder ball shape or a solder bump shape. The external terminal 156 may be electrically connected through the redistribution layer 150 to the first semiconductor chip 100.

The second semiconductor chip 200 may be disposed on the first semiconductor chip 100. The second semiconductor chip 200 may include a second semiconductor layer 210, a second circuit layer 220, a second via 230, a second bonding pad 240, color filters CF, and micro-lenses ML. The second semiconductor layer 210 may include a semiconductor material, such as silicon, silicon germanium, or impurity-doped semiconductor. The second semiconductor layer 210 may be provided therein with photoelectric conversion elements PD. Each of the photoelectric conversion elements PD may independently receive light irradiated from a top surface of the second semiconductor chip 200. The photoelectric conversion elements PD may each have a conductivity type different from that of the second semiconductor layer 210. The second circuit layer 220 may be disposed below the second semiconductor chip 200, thereby being adjacent to the first semiconductor chip 100. The second circuit layer 220 may include wiring patterns and integrated circuits such as transistors for driving the photoelectric conversion elements PD. The second circuit layer 220 may be electrically connected to the photoelectric conversion elements PD in the second semiconductor layer 210. The second via 230 may penetrate the second semiconductor layer 210 and have electrical connection with the second circuit layer 220. The second bonding pad 240 may be disposed on a bottom surface of the second semiconductor chip 200. For example, the bottom surface of the second semiconductor chip 200 may be an active surface. The second circuit layer 220, the second via 230, and the second bonding pad 240 may include a metallic material, such as copper (Cu), aluminum (Al), nickel (Ni), or tungsten (W).

The second bonding pad 240 may be in contact with the first bonding pad 140. Therefore, the second semiconductor chip 200 may be electrically connected to the first semiconductor chip 100 through the first bonding pad 140 and the second bonding pad 240. The second via 230 may penetrate at least a portion of the second semiconductor chip 200. The second via 230 may penetrate the second semiconductor chip 200 and have electrical connection with the first semiconductor chip 100. Alternatively, the second via 230 may penetrate a portion of the second semiconductor chip 200 and have electrical connection with the second semiconductor chip 200.

The color filters CF may be disposed on a top surface of the second semiconductor layer 210. The color filters CF may be disposed to correspond to the photoelectric conversion elements PD. The color filters CF may include one or more of red, green, blue, and white colors. The micro-lenses ML may be disposed on the color filters CF. A unit pixel P may be defined by a single color filter CF, a single micro-lens ML that corresponds to the single color filter CF, and at least one photoelectric conversion element PD that corresponds to the single color filter CF and the single micro-lens ML. A plurality of unit pixels P may be two-dimensionally arranged on the top surface of the second semiconductor layer 210. The second semiconductor layer 210 may include the unit pixels P at its central portion that is defined as an active array region AAR. For example, when viewed in plan, the active array region AAR may be a section where the micro-lenses ML are exposed by a transparent member 500 which will be discussed below. The active array region AAR may have a planar area of about 5.350 mm×4.045 mm. The second semiconductor layer 210 may not include the unit pixels P along its outer edge that is defined as an adhesive region to which is adhered a spacer which will be discussed below.

In other example embodiments, the image sensor part IS may further include third semiconductor chips 300. As shown in FIG. 2, the image sensor part IS may include at least one third semiconductor chip 300 provided below the first semiconductor chip 100. The third semiconductor chips 300 may be spaced apart from each other.

The third semiconductor chips 300 may include a memory chip, such as dynamic random access memory (DRAM), static random access memory (SRAM), magnetic random access memory (MRAM), or Flash memory. The third semiconductor chips 300 may include a semiconductor material, such as silicon (Si) or germanium (Ge). The third semiconductor chips 300 may include integrated circuits. For example, the integrated circuits may be a memory device, a logic device, or a passive device (e.g., capacitor). Top surfaces of the third semiconductor chips 300 may be active surfaces. For example, the third semiconductor chips 300 may each include a third circuit layer 310 and a third bonding pad 320 on an upper portion thereof. The third circuit layers 310 may include wiring patterns. The third bonding pads 320 may be electrically connected to the integrated circuits in the third semiconductor chips 300. The third semiconductor chips 300 may be the same chip. Alternatively, one of the third semiconductor chips 300 may be a memory chip, and another of the third semiconductor chips 300 may be a dummy chip. For example, the another third semiconductor chip 300 that constitutes the dummy chip may have either a single-layered structure made of a single material or a multi-layered structure made of a plurality of different materials. The dummy chip may include polysilicon or bulk metal. Alternatively, the third semiconductor chips 300 may each include a memory chip, a logic chip, a passive device, a dummy chip, or a combination thereof.

The third semiconductor chips 300 may each be electrically connected to the redistribution layer 150 through a connection terminal 330. For example, the connection terminal 330 may be provided between the redistribution pattern 154 of the redistribution layer 150 and the third bonding pad 320 of the third semiconductor chip 300.

A molding layer 400 may be provided between the redistribution layer 150 and the third semiconductor chips 300. The molding layer 400 may cover the third semiconductor chips 300. The molding layer 400 may fill a space between the third semiconductor chips 300. The molding layer 400 may not cover bottom surfaces of the third semiconductor chips 300. The molding layer 400 may prevent the third semiconductor chips 300 from being damaged due to external impact, moisture, and the like. The molding layer 400 may include a dielectric polymer, such as an epoxy molding compound (EMC). The following will discuss the example embodiment shown in FIG. 1.

Referring again to FIGS. 1 and 3, a transparent member 500 may be disposed on the image sensor part IS. The transparent member 500 may have a plate shape that covers the image sensor part IS. The transparent member 500 may be disposed on the second semiconductor chip 200, and may filter a specific range of incident light that is introduced into the second semiconductor chip 200. For example, the transparent member 500 may include a polymer or glass that is coated by an optical material for filtering or improving optical sensitivity at desired wavelength ranges. The transparent member 500 may be spaced apart from the micro-lenses ML. For example, the transparent member 500 may be spaced apart at about 300 μm to about 500 μm from the second semiconductor chip 200. The transparent member 500 may have a width substantially the same as that of the first semiconductor chip 100 or that of the second semiconductor chip 200.

A spacer 600 may be provided between the image sensor part IS and the transparent member 500. The spacer 600 may be disposed between the second semiconductor chip 200 and the transparent member 500. The transparent member 500 may be directly attached through the spacer 600 to the top surface of the second semiconductor chip 200. The transparent member 500 may have a top surface at a higher level than that of top surfaces of the micro-lenses ML. An interval between the transparent member 500 and the second semiconductor chip 200 may correspond to a height h of the spacer 600. For example, the height h of the spacer 600 may range from about 300 μm to about 500 μm. The spacer 600 may be placed on an outer edge (e.g., the adhesive region of the second semiconductor layer 210) of the second semiconductor chip 200. In some example embodiments, the spacer 600 may have an annular shape when viewed in plan. For example, the spacer 600 may have a tetragonal ring shape. The spacer 600 may define an inner space between the transparent member 500 and the second semiconductor chip 200. The spacer 600 may expose the active array region AAR on the second semiconductor chip 200. For example, the spacer 600 may be spaced apart from the active array region AAR, and when viewed in plan, may surround the active array region AAR. The spacer 600 may have a sidewall with a width w that ranges from about 50 μm to about 200 μm.

The spacer 600 may have an outer surface 600a aligned with a lateral surface 500a of the transparent member 500. For example, the spacer 600 may have an overall width d that is the same as the width of the transparent member 500, and the outer surface 600a of the spacer 600 may be coplanar with the lateral surface 500a of the transparent member 500. The overall width d of the spacer 600 may indicate a distance from the outer surface 600a to an opposite outer surface of the spacer 600.

In other example embodiments, the outer surface 600a of the spacer 600 may be spaced apart from the lateral surface 500a of the transparent member 500. For example, as shown in FIG. 4, the spacer 600 may have an overall width greater than the width of the transparent member 500, and the spacer 600 may protrude from the lateral surface 500a of the transparent member 500. Therefore, the spacer 600 may have a top surface 600c that includes a portion that is exposed and another portion that is in contact with the transparent member 500. In this case, a step difference may be provided between the outer surface 600a of the spacer 600 and the lateral surface 500a of the transparent member 500.

Referring back to FIGS. 1 and 3, the outer surface 600a of the spacer 600 may be spaced apart from a lateral surface 200a of the second semiconductor chip 200. For example, the overall width d of the spacer 600 may be greater than the width of the second semiconductor chip 200, and the spacer 600 may protrude from the lateral surface 200a of the second semiconductor chip 200. Therefore, the spacer 600 may have a bottom surface 600b that includes a portion that is exposed and another portion that is in contact with the second semiconductor chip 200. In this case, a step difference may be provided between the outer surface 600a of the spacer 600 and the lateral surface 200a of the second semiconductor chip 200.

The spacer 600 may include a supporter 610, a first adhesive pattern 620, and a second adhesive pattern 630.

The supporter 610 may be disposed between the second semiconductor chip 200 and the transparent member 500. The supporter 610 may separate the transparent member 500 from the second semiconductor chip 200, and may support the transparent member 500 on the second semiconductor chip 200. The supporter 610 may have an annular shape when viewed in plan. The supporter 610 may have a modulus the same as or greater than that of the second semiconductor chip 200. In this description, the language "modulus" may indicate Yong's modulus. The modulus of the supporter 610 may range from about 10 GPa to about 200 GPa. The supporter 610 may have a thermal expansion coefficient less than that of the second semiconductor chip 200. The thermal expansion coefficient of the supporter 610 may range from about 1 ppm/K to about 10 ppm/K. For example, the supporter 610 may include silicon (Si), glass, or metal. Therefore, the transparent member 500 may be rigidly supported on the second semiconductor chip 200. In addition, because the supporter 610 has a low thermal expansion coefficient, the supporter 610 may be less deformed due to heat generated from fabrication processes or produced during the operation of a semiconductor package. As a result, a semiconductor package may increase in thermal stability.

The first and second adhesive patterns 620 and 630 may be respectively disposed on top and bottom surfaces of the supporter 610. On the bottom surface of the supporter 610, the first adhesive pattern 620 may attach the supporter 610 to the second semiconductor chip 200. On the top surface of the supporter 610, the second adhesive pattern 630 may attach the supporter 610 to the transparent member 500. The first and second adhesive patterns 620 and 630 may include a film-shaped adhesive member. For example, the first and second adhesive patterns 620 and 630 may include a die attach film (DAF), a non-conductive film (NCF), an anisotropic film (ACF), or an ultraviolet (UV) film. Therefore, without overflow of the first adhesive pattern 620 or the second adhesive pattern 630, the supporter 610 may be attached to the second semiconductor chip 200 and the transparent member 500.

Figure 5:
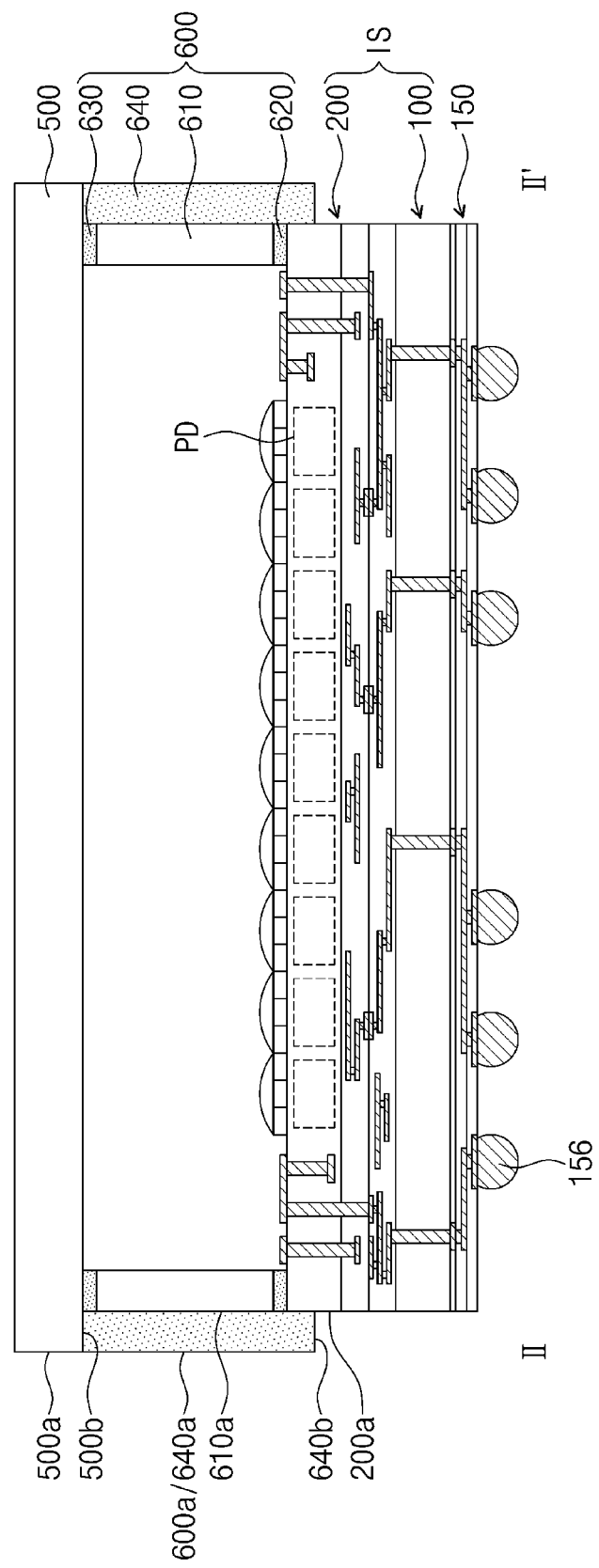
Figure 6:
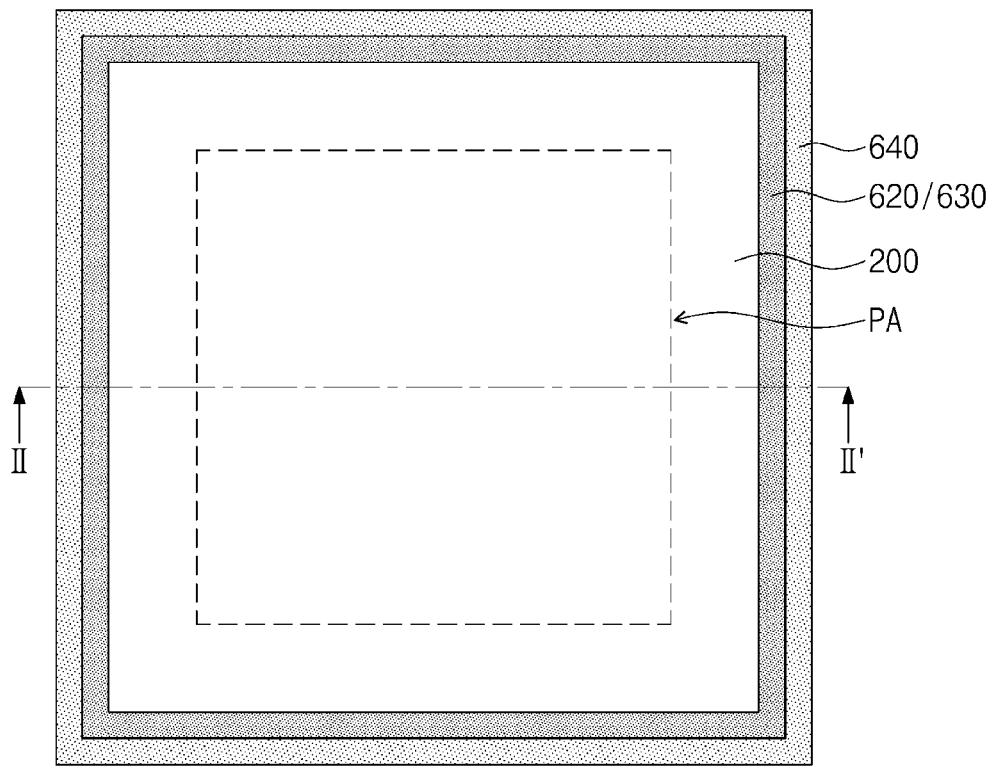
FIG. 6 illustrates a plan view showing a semiconductor package according to some example embodiments.

FIG. 5 illustrates a cross-sectional view showing a semiconductor package according to some example embodiments. FIG. 6 illustrates a plan view showing a semiconductor package according to some example embodiments, and FIG. 5 corresponds to a cross-section taken along line II-IF of FIG. 6. For brevity of description, components the same as those of the example embodiments discussed with reference to FIGS. 1 to 4 are allocated the same reference numerals thereto, and a repetitive explanation thereof will be omitted or abridged below.

Referring to FIGS. 5 and 6, the spacer 600 may include a supporter 610, a first adhesive pattern 620, a second adhesive pattern 630, and an additional adhesive layer 640.

The supporter 610 may be disposed between the second semiconductor chip 200 and the transparent member 500. The supporter 610 may separate the transparent member 500 from the second semiconductor chip 200, and may support the transparent member 500 on the second semiconductor chip 200. The supporter 610 may have an annular shape when viewed in plan. The supporter 610 may have a small width. For example, the supporter 610 may have a sidewall that has a width that ranges from about 20 μm to about 100 μm. The small width of the supporter 610 may cause incident light from the transparent member 500 to have small amounts of reflection, flare, scattering, and absorption at the supporter 610. As a result, a semiconductor package may increase in optical sensitivity. The outer surface 610a of the supporter 610 may be aligned with the lateral surface 200a of the second semiconductor chip 200. For example, the supporter 610 may have an overall width the same as the width of the second semiconductor chip 200, and the outer surface 610a of the supporter 610 may be coplanar with the lateral surface 200a of the second semiconductor chip 200. The supporter 610 may have a stiffness the same as or greater than that of the second semiconductor chip 200.

The first and second adhesive patterns 620 and 630 may be respectively disposed on top and bottom surfaces of the supporter 610. On the bottom surface of the supporter 610, the first adhesive pattern 620 may attach the supporter 610 to the second semiconductor chip 200. On the top surface of the supporter 610, the second adhesive pattern 630 may attach the supporter 610 to the transparent member 500. The first and second adhesive patterns 620 and 630 may include a film-shaped adhesive member.

The additional adhesive layer 640 may be disposed on the outer surface 610a of the supporter 610. When viewed in plan, the additional adhesive layer 640 may surround the supporter 610. The additional adhesive layer 640 may upwardly extend from the outer surface 610a of the supporter 610, and may contact the bottom surface 500b of the transparent member 500. The additional adhesive layer 640 may extend from the outer surface 610a of the supporter 610, and may extend onto the lateral surface 200a of the second semiconductor chip 200. The additional adhesive layer 640 may have an outer surface 640a aligned with a lateral surface 500a of the transparent member 500. The outer surface 610a of the supporter 610 may correspond to the outer surface 640a of the additional adhesive layer 640. The additional adhesive layer 640 may have a bottom surface 640b at a level that is lower than that of the top surface of the second semiconductor chip 200 and is higher than that of the bottom surface of the second semiconductor chip 200. The additional adhesive layer 640 may be in contact with the bottom surface 500b of the transparent member 500, the outer surface 610a of the supporter 610, and the lateral surface 200a of the second semiconductor chip 200. Therefore, the additional adhesive layer 640 may stably attach the supporter 610 to the transparent member 500 and the second semiconductor chip 200. The additional adhesive layer 640 may include an adhesive member. For example, the additional adhesive layer 640 may include an adhesive polymer, a non-conductive paste (NCP), an instant adhesive, a thermosetting adhesive, a laser-curable adhesive, or an ultrasonic-curable adhesive. The additional adhesive layer 640 may include various adhesive members other than those mentioned above.

Because not only the first and second adhesive patterns 620 and 630 but also the additional adhesive layer 640 is used to attach the spacer 600 to the transparent member 500 and the second semiconductor chip 200, a semiconductor package may increase in structural stability. In addition, because the spacer 600 is attached not only to the top surface of the second semiconductor chip 200 but also to the lateral surface 200a of the second semiconductor chip 200, the spacer 600 may be more rigidly attached to the second semiconductor chip 200.

Figure 7:
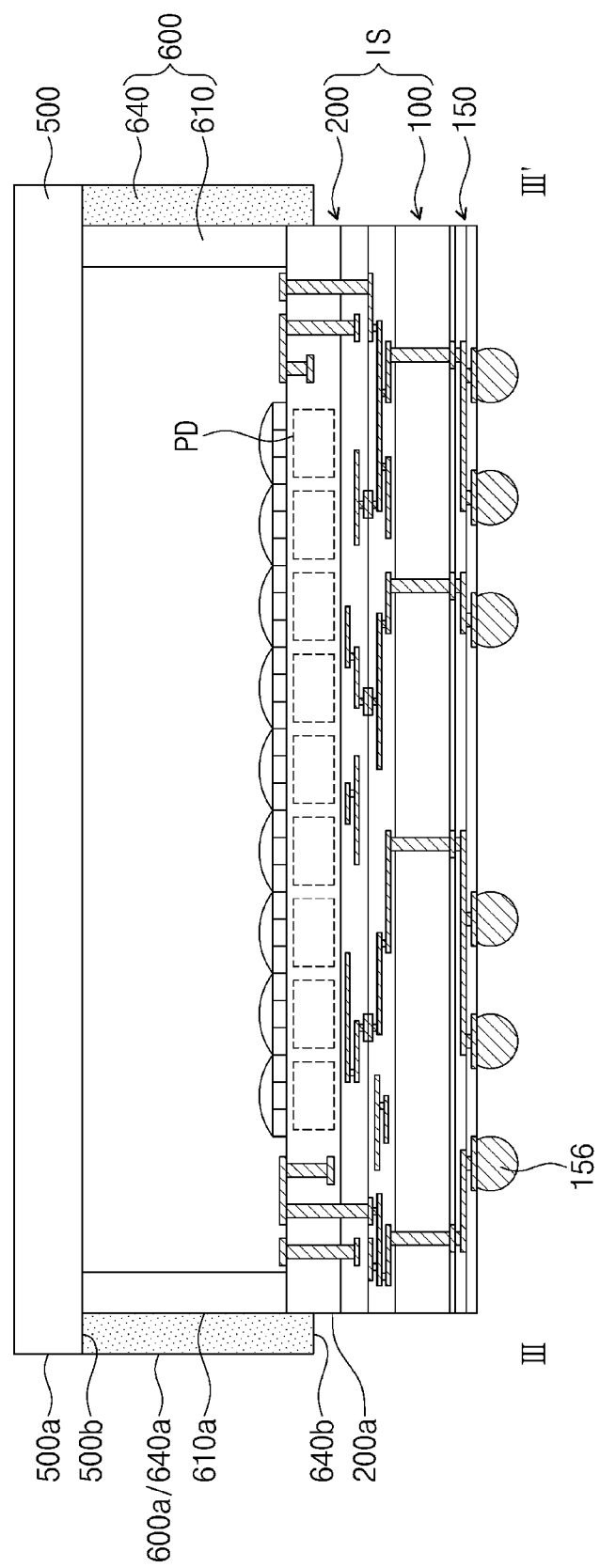
FIG. 7 illustrates a cross-sectional view showing a semiconductor package according to some example embodiments.
Figure 8:
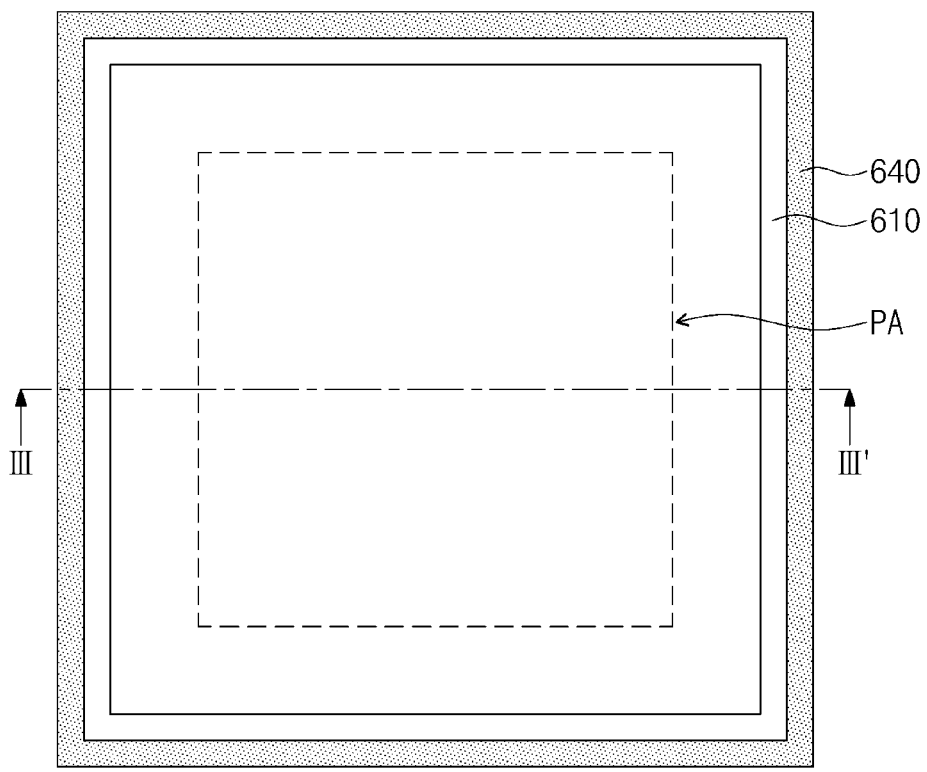
FIGS. 8 and 9 illustrate cross-sectional views showing a semiconductor package according to some example embodiments.
Figure 9:
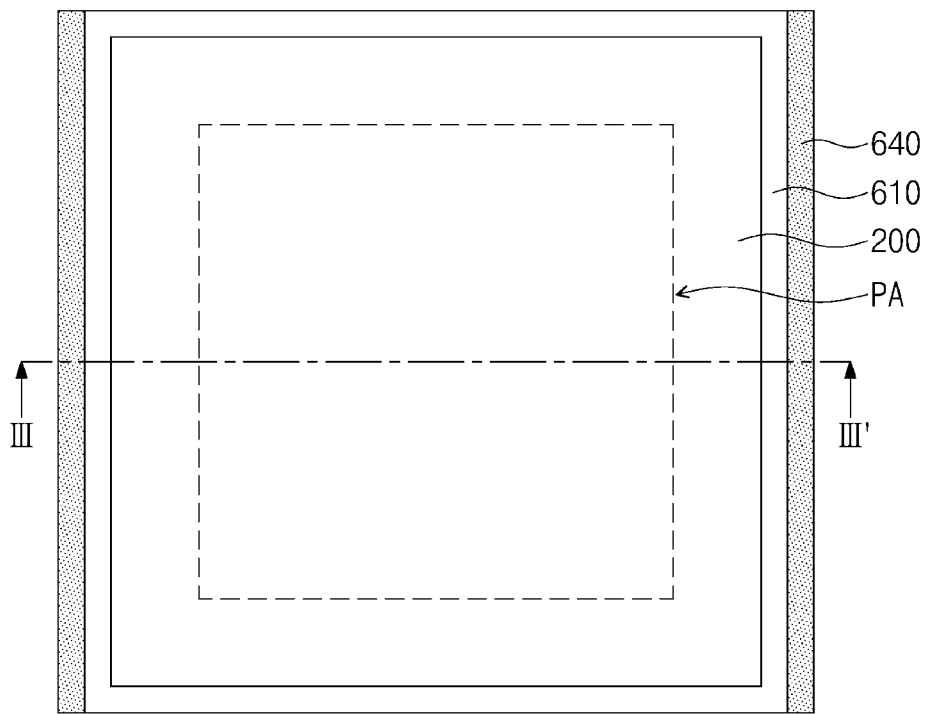

FIG. 7 illustrates a cross-sectional view showing a semiconductor package according to some example embodiments. FIGS. 8 and 9 illustrate plan views showing a semiconductor package according to some example embodiments, and FIG. 7 corresponds to a cross-section taken along line of FIG. 8 or 9.

Referring to FIGS. 7 and 8, the spacer 600 may include a supporter 610 and an additional adhesive layer 640.

The supporter 610 may be disposed between the second semiconductor chip 200 and the transparent member 500. The supporter 610 may separate the transparent member 500 from the second semiconductor chip 200, and simultaneously may attach the transparent member 500 to the second semiconductor chip 200. The supporter 610 may separate the transparent member 500 from the second semiconductor chip 200, and may support the transparent member 500 on the second semiconductor chip 200. The supporter 610 may have an annular shape when viewed in plan. The supporter 610 may have a small width. For example, the supporter 610 may have a sidewall that has a width from about 20 μm to about 100 μm. The small width of the supporter 610 may cause incident light from the transparent member 500 to have small amounts of reflection, flare, scattering, and absorption at the supporter 610. As a result, a semiconductor package may increase in optical sensitivity. The outer surface 610a of the supporter 610 may be aligned with the lateral surface 200a of the second semiconductor chip 200. For example, the supporter 610 may have an overall width the same as the width of the second semiconductor chip 200, and the outer surface 610a of the supporter 610 may be coplanar with the lateral surface 200a of the second semiconductor chip 200. The supporter 610 may include a non-conductive adhesive material. For example, the supporter 610 may include a dry film resist (DFR) or a photo-imageable dielectric (PID).

The additional adhesive layer 640 may be disposed on the outer surface 610a of the supporter 610. When viewed in plan, the additional adhesive layer 640 may surround the supporter 610. Alternatively, the additional adhesive layer 640 may partially cover the outer surface 610a of the supporter 610. As shown in FIG. 9, the additional adhesive layer 640 may cover a portion of the outer surface 610a of the supporter 610, and may expose another portion of the outer surface 610a of the supporter 610. FIG. 9 shows that the additional adhesive layer 640 covers only oppositely facing sides of the outer surface 610a of the supporter 610, but example embodiments are not limited thereto. The following will again the example embodiment of FIGS. 7 and 8.

The additional adhesive layer 640 may upwardly extend from the outer surface 610a of the supporter 610, and may contact the bottom surface 500b of the transparent member 500. The additional adhesive layer 640 may extend from the outer surface 610a of the supporter 610, and may extend onto the lateral surface 200a of the second semiconductor chip 200. The additional adhesive layer 640 may have a bottom surface 640b at a level that is lower than that of the top surface of the second semiconductor chip 200 and is higher than that of the bottom surface of the second semiconductor chip 200. The additional adhesive layer 640 may be in contact with the bottom surface 500b of the transparent member 500, the outer surface 610a of the supporter 610, and the lateral surface 200a of the second semiconductor chip 200. Therefore, the additional adhesive layer 640 may stably attach the supporter 610 to the transparent member 500 and the second semiconductor chip 200. The additional adhesive layer 640 may include an adhesive member. For example, the additional adhesive layer 640 may include an adhesive polymer, a non-conductive paste (NCP), an instant adhesive, a thermosetting adhesive, a laser-curable adhesive, or an ultrasonic-curable adhesive. The additional adhesive layer 640 may include various adhesive members other than those mentioned above.

Because not only the supporter 610 but also the additional adhesive layer 640 is used to attach the spacer 600 to the transparent member 500 and the second semiconductor chip 200, a semiconductor package may increase in structural stability. In addition, because the spacer 600 is attached not only to the top surface of the second semiconductor chip 200 but also to the lateral surface 200a of the second semiconductor chip 200, the spacer 600 may be more rigidly attached to the second semiconductor chip 200.

Figure 12:
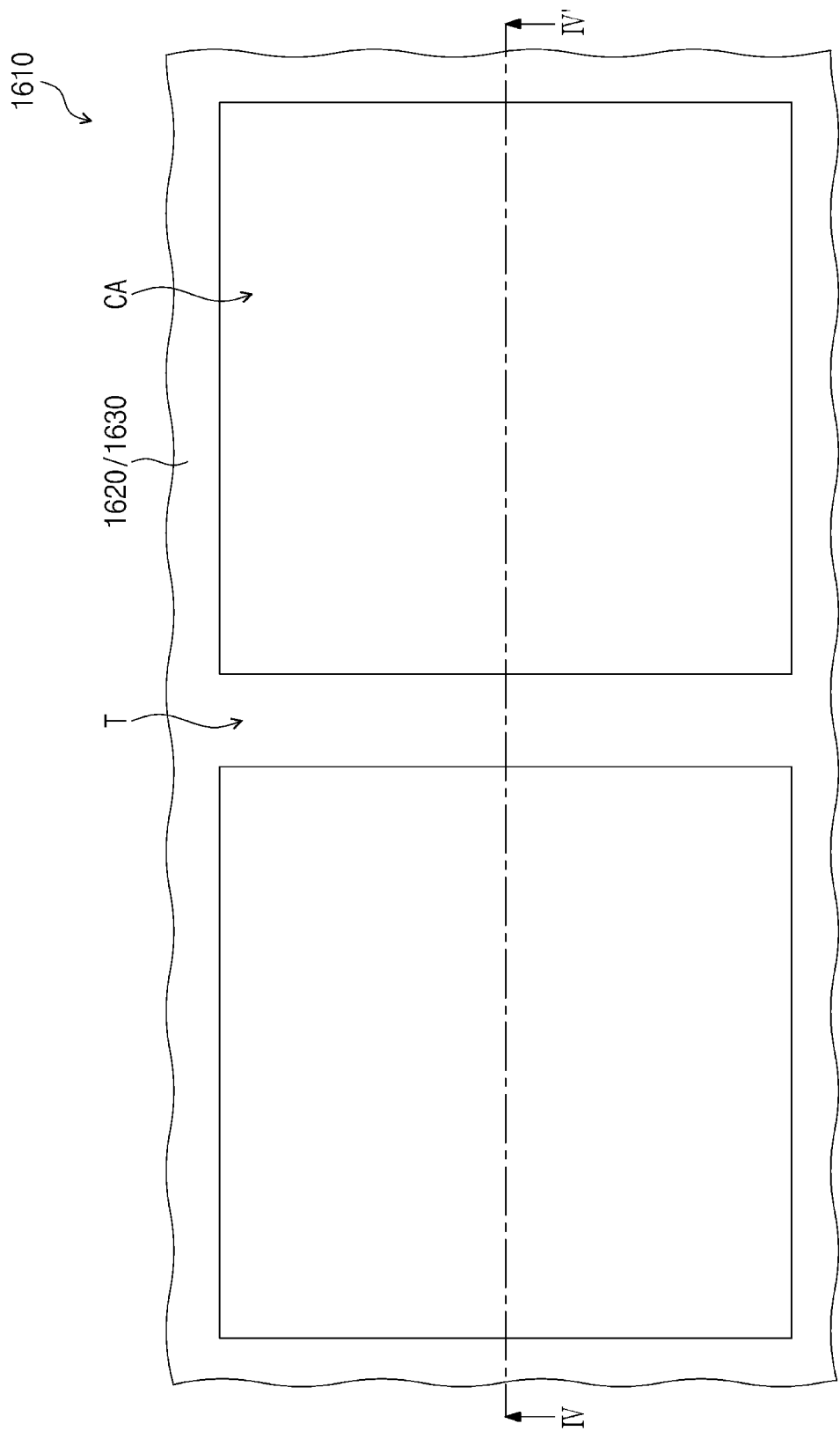

FIGS. 10 to 15 illustrate diagrams showing a method of fabricating a semiconductor package according to some example embodiments. FIGS. 10, 11, and 13 to 15 are cross-sectional views, FIG. 12 is a plan view of FIG. 11, and FIG. 11 corresponds to a cross-section taken along line IV-IV' of FIG. 12.

Referring to FIG. 10, a first substrate 1610 may be provided. The first substrate 1610 may include a material with a high stiffness. For example, the first substrate 1610 may have a modulus ranging from about 10 GPa to about 200 GPa. The first substrate 1610 may include a material with a low thermal expansion coefficient. For example, the thermal expansion coefficient of the first substrate 1610 may range from about 1 ppm/K to about 10 ppm/K. The first substrate 1610 may include silicon (Si), glass, or metal.

A first adhesive layer 1620 may be formed below the first substrate 1610. A second adhesive layer 1630 may be formed on the first substrate 1610. For example, an adhesive film may be attached to each of top and bottom surfaces of the first substrate 1610. The adhesive film may include a film-shaped adhesive member. For example, the adhesive film may include a die attach film (DAF), a non-conductive film (NCF), an anisotropic film (ACF), or an ultraviolet (UV) film.

Referring to FIGS. 11 and 12, a first etching process may be performed on the first substrate 1610. For example, a laser drilling process may be employed as the first etching process that etches the first substrate 1610. The first substrate 1610 may be etched to form one or more cavities CA. The cavities CA may be spaced apart from each other. FIG. 12 shows the first substrate 1610 in which are formed two cavities CA that are spaced apart from each other in one direction, but example embodiments are not limited thereto. When viewed in plan, the first substrate 1610 may have therein the cavities CA that are arranged in one direction or in two intersecting directions. For example, the first substrate 1610 may be etched to have a grid shape when viewed in plan.

The first and second adhesive layers 1620 and 1630 may also be etched when the first substrate 1610 is etched in the first etching process. At this stage, the etched first and second adhesive layers 1620 and 1630 may have a planar shape that is the same as that of the etched first substrate 1610. The cavities CA may be formed to penetrate the first adhesive layer 1620, the first substrate 1610, and the second adhesive layer 1630.

Figure 13:
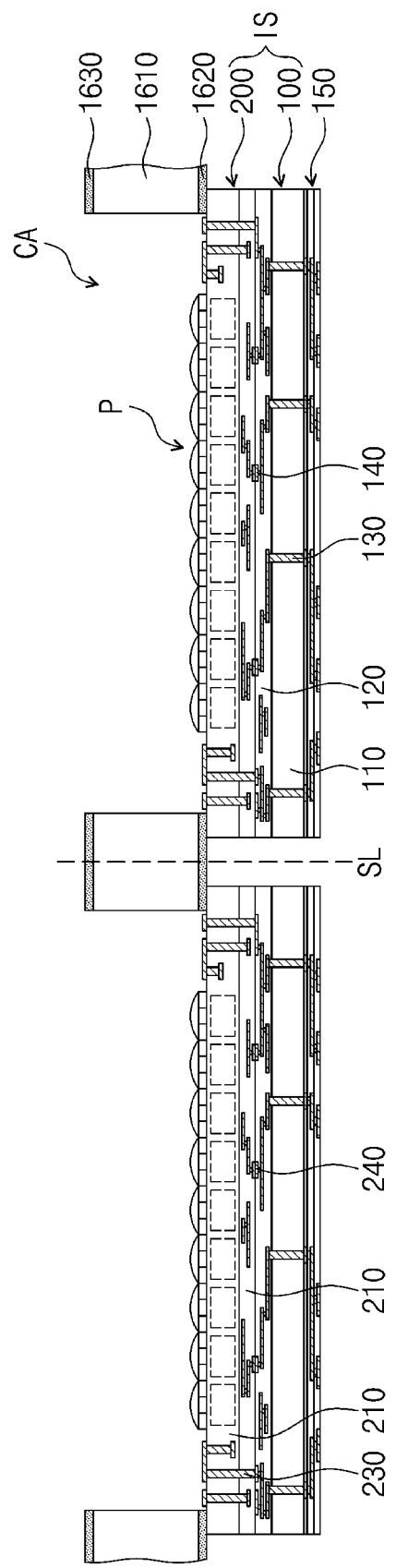

Referring to FIG. 13, image sensor parts IS may be provided. The image sensor parts IS may be the same as or similar to the image sensor part IS discussed with reference to FIG. 1. For example, the image sensor parts IS may each include a first semiconductor chip 100 as a logic chip and a second semiconductor chip 200 as a sensing chip. Pixel elements P may be arranged on the top surface of the second semiconductor chip 200.

The first semiconductor chip 100 may include a first semiconductor layer 110, a first circuit layer 120 provided on the first semiconductor layer 110, a first via 130 that penetrates the first semiconductor layer 110 and has electrical connection with the first circuit layer 120, and a first bonding pad 140 disposed on a top surface of the first semiconductor chip 100. A logic transistor may be provided in the first semiconductor layer 110. A redistribution layer 150 may be provided below the first semiconductor chip 100. The redistribution layer 150 may include dielectric layers 152 and a redistribution pattern 154.

The second semiconductor chip 200 may include a second semiconductor layer 210, a second circuit layer 220 that is disposed on one surface of the second semiconductor chip 200 and is adjacent to the first semiconductor chip 100, a second via 230 that penetrates the second semiconductor layer 210 and has electrical connection with the second circuit layer 220, a second bonding pad 240 disposed on the one surface of the second semiconductor chip 200, and color filters CF and micro-lenses ML disposed on the second semiconductor layer 210. Photoelectric conversion elements PD may be provided in the second semiconductor layer 210. The second circuit layer 220 may include wiring patterns and transistors for driving the photoelectric conversion elements PD. The second bonding pad 240 may be in contact with the first bonding pad 140.

The image sensor parts IS may be attached to the first substrate 1610. The image sensor parts IS may be adhered to the first substrate 1610 so as to cause the second semiconductor chip 200 to face the first substrate 1610. For example, the first adhesive layer 1620 may be used to attach the image sensor parts IS to the first substrate 1610. The first adhesive layer 1620 may be in contact with an outer edge of the image sensor IS, or with the adhesive region of the second semiconductor layer 210 discussed with reference to FIGS. 1 and 3. At this stage, when viewed in plan, each of the image sensor parts IS may be attached to cause its active array region AAR to rest inside the cavity CA. The first substrate 1610 may have inner surfaces that are toward the cavities CA and are spaced apart from the active array regions AAR of the image sensor parts IC. The image sensor parts IS may be spaced apart from each other while being attached to the first substrate 1610. For example, when the first substrate 1610 experiences the etching process discussed with reference to FIG. 11, an arrangement period in which the cavities CA are formed, or a pitch of the cavities CA, may be greater than a width of the image sensor parts IS.

Figure 14:
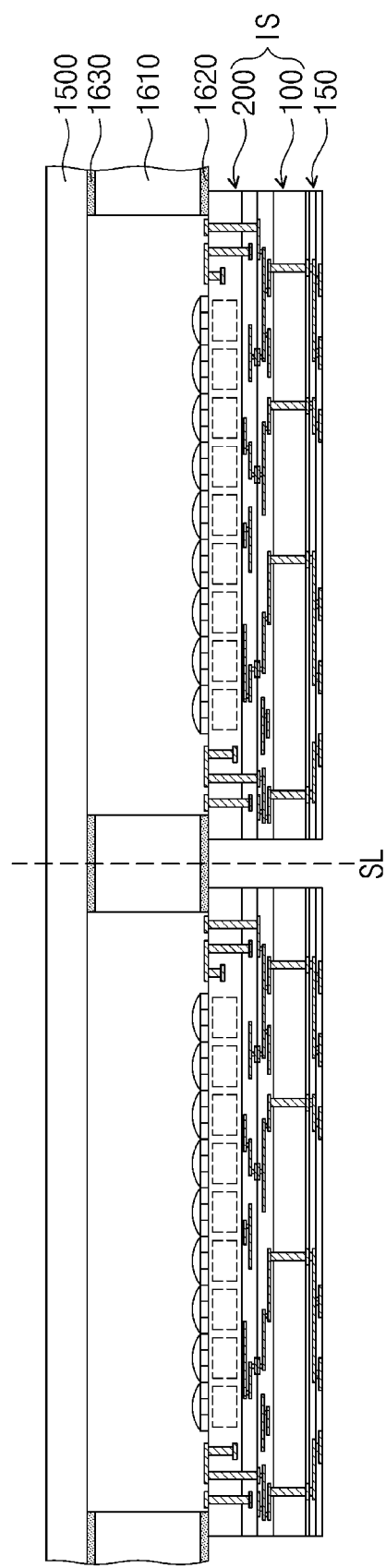
Figure 15:
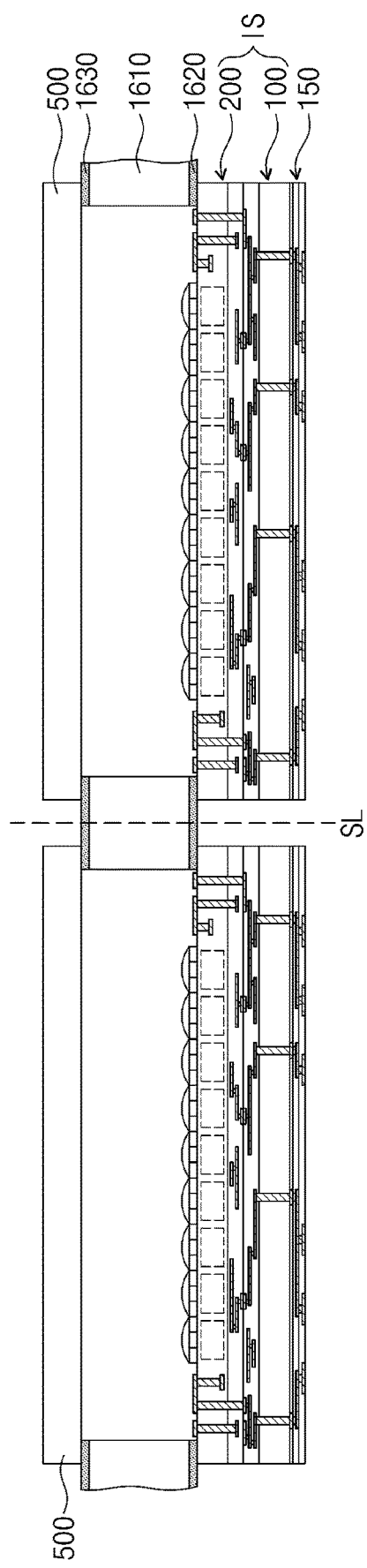

Referring to FIG. 14, a transparent substrate 1500 may be attached to the first substrate 1610. The first substrate 1610 may be attached with the image sensor parts IS on one side, and may also be attached with the transparent substrate 1500 on another side opposite to the one side. For example, the second adhesive layer 1630 may be used to attach the transparent substrate 1500 to the first substrate 1610. The transparent substrate 1500 may be fixedly spaced apart from the image sensor parts IS across the first substrate 1610. The transparent substrate 1500 may include a polymer or glass that is coated by an optical material for filtering or improving the sensitivity of light at desired wavelength ranges.

Afterwards, the first substrate 1610 and the transparent substrate 1500 may be cut into spacers (see the spacer 600 of FIG. 1) and transparent members (see the transparent member 500 of FIG. 1). For example, the transparent substrate 1500 and the first substrate 1610 may undergo a singulation process performed along a sawing line SL. Thus, the first substrate 1610 and the transparent substrate 1500 may be diced into semiconductor packages that are divided from each other. The image sensor parts IS may be spaced apart from each other, and the sawing line SL may be positioned between and spaced apart from the image sensor parts IS.

Referring back to FIG. 1, external terminals 156 may be provided on a bottom surface of a redistribution layer 150 of each image sensor part IS. As a result, a semiconductor package may be fabricated as shown in FIG. 1.

In some example embodiments, the first and second adhesive layers 1620 and 1630 may include a film-shaped adhesive member. Therefore, when the first substrate 1610 is attached with the image sensor parts IS and the transparent substrate 1500, the first and second adhesive layers 1620 and 1630 may be free of overflow. In conclusion, there is less possibility of occurrence of defects in fabricating a semiconductor package.

FIG. 14 shows that the transparent substrate 1500 is attached to the first substrate 1610, but example embodiments are not limited thereto. Alternatively, the transparent members 500 may be attached to the first substrate 1610. The transparent members 500 may be spaced apart while being attached to the first substrate 1610. For example, when the first substrate 1610 experiences the etching process discussed with reference to FIG. 11, an arrangement period in which the cavities CA are formed may be greater than a width of the transparent members 500.

Thereafter, the first substrate 1610 may be cut into spacers (see the spacer 600 of FIG. 1). For example, the first substrate 1610 may undergo a singulation process performed along a sawing line SL. Thus, the first substrate 1610 may be diced into semiconductor packages that are divided from each other. The transparent members 500 may be spaced apart from each other, and the sawing line SL may be positioned between and spaced apart from the transparent members 500. As such, a semiconductor package may be fabricated as shown in FIG. 4.

Figure 16:
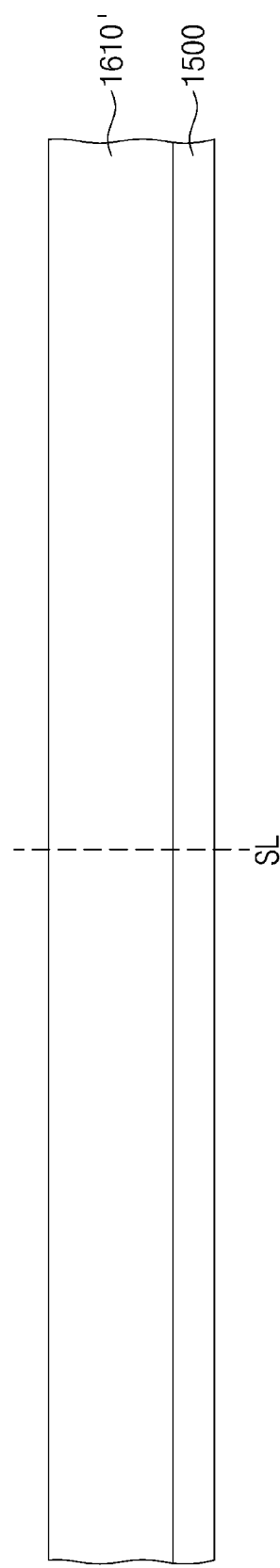
FIGS. 16 to 20 illustrate diagrams showing a method of fabricating a semiconductor package according to some example embodiments.
Figure 17:
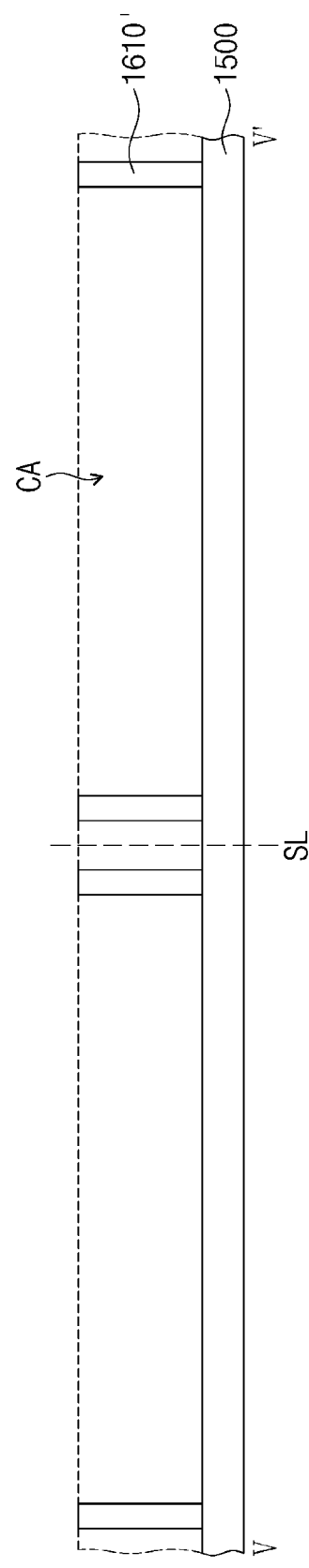
Figure 18:
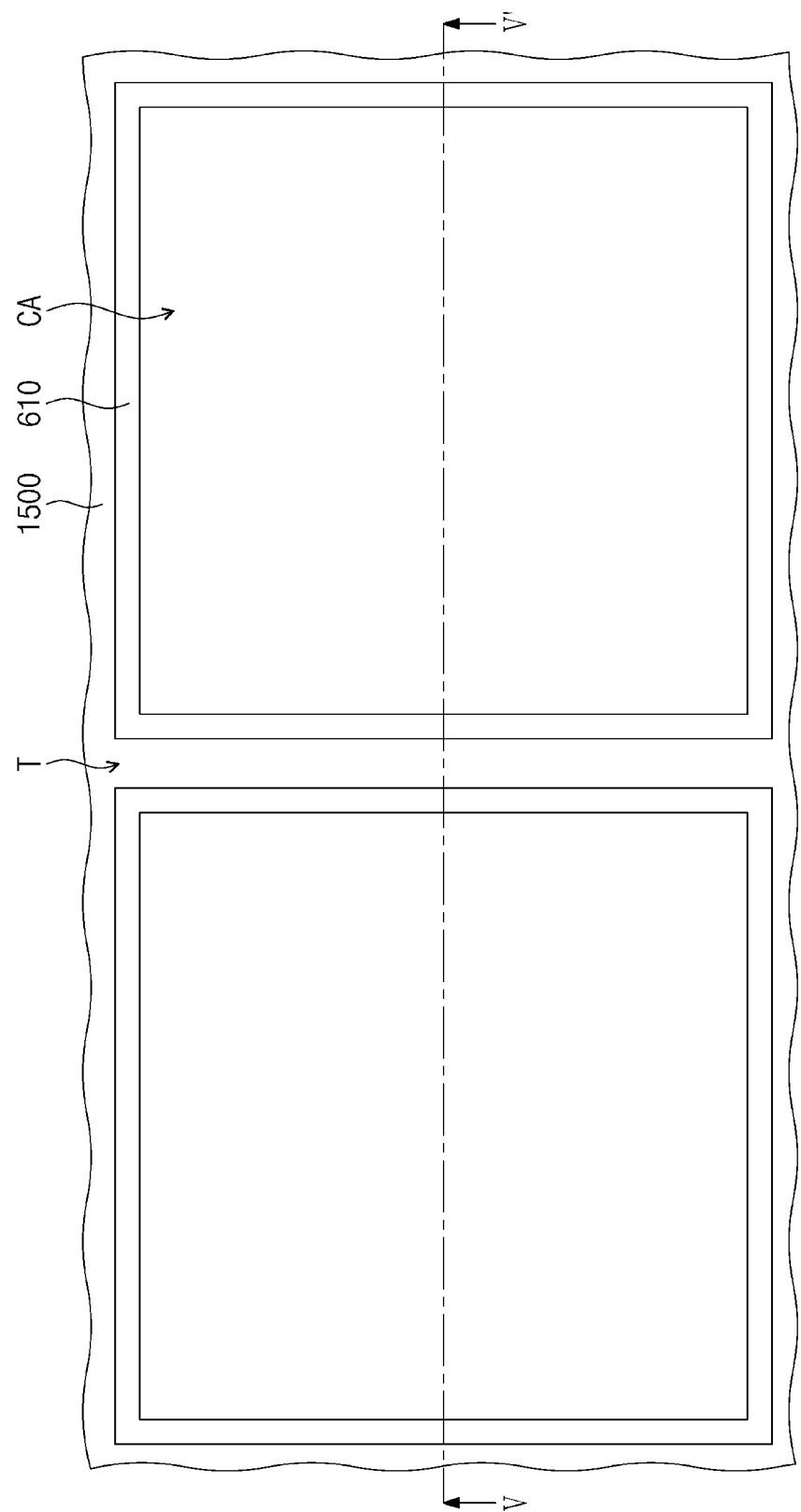
Figure 19:
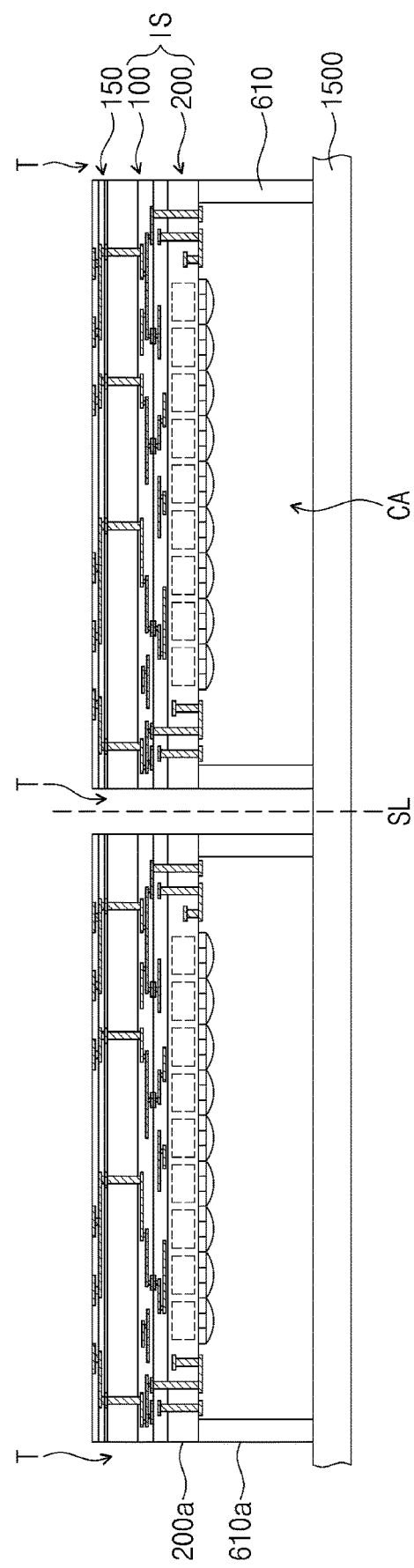

FIGS. 16 to 20 illustrate diagrams showing a method of fabricating a semiconductor package according to some example embodiments. FIGS. 16, 17, and 19 are cross-sectional views, FIG. 18 is a plan view of FIG. 17, and FIG. 17 corresponds to a cross-section taken along line V-V' of FIG. 18.

Referring to FIG. 16, a second substrate 1610' may be provided. The second substrate 1610' may include a non-conductive adhesive material. For example, the second substrate 1610' may include a dry film resist (DFR) or a photo-imageable dielectric (PID).

The second substrate 1610' may be attached to a transparent substrate 1500. The transparent substrate 1500 may include a polymer or glass that is coated by an optical material for filtering or improving the sensitivity of light at desired wavelength ranges.

Referring to FIGS. 17 and 18, the second substrate 1610' may experience a second etching process. For example, a laser drilling process may be employed as the second etching process that etches the second substrate 1610'. The second substrate 1610' may be etched to form a plurality of supporters 610. For example, the second substrate 1610' may be etched to form one or more cavities CA. The cavities CA may be spaced apart from each other. FIG. 18 shows the second substrate 1610' in which are formed two cavities CA that are spaced apart from each other in one direction, but example embodiments are not limited thereto. When viewed in plan, the second substrate 1610' may have therein the cavities CA that are arranged in one direction or in two intersecting directions.

In performing the second etching process on the second substrate 1610', the second substrate 1610' may be etched to also form a trench T. The trench T may be formed between the cavities CA. When viewed in plan, the trench T may be formed to have a grid shape and also to surround each of the cavities CA. Therefore, the second substrate 1610' may be etched to separate the supporters 610 from each other. For example, the trench T may separate the supporters 610 from each other, and the cavities CA formed inside the supporters 610 may cause the supporters 610 to each have a tetragonal ring shape.

Referring to FIG. 19, image sensor parts IS may be provided. The image sensor parts IS may be the same as or similar to the image sensor part IS discussed with reference to FIG. 1. For example, the image sensor parts IS may each include a first semiconductor chip 100 as a logic chip and a second semiconductor chip 200 as a sensing chip.

The image sensor parts IS may be attached to the supporters 610. The image sensor parts IS may be adhered to the supporters 610 so as to cause the second semiconductor chip 200 to face the supporters 610. The images sensor parts IS may be positioned above the cavities CA, and the supporter 610 may be in contact with an outer edge of the image sensor part IS, or with the adhesive region of the second semiconductor layer 210 discussed with reference to FIGS. 1 and 3. At this stage, when viewed in plan, each of the image sensor parts IS may be attached to cause its active array region AAR to rest inside the cavity CA. The first substrate 1610 may have inner surfaces that are toward the cavities CA and are spaced apart from the active array regions AAR of the image sensor parts IC. The image sensor parts IS may be spaced apart from each other while being attached to the supporters 610. For example, the image sensors IS may be provided on the cavities CA, but not on the trench T. The supporters 610 may have outer surfaces 610a that are aligned with a lateral surface 200a of the second semiconductor chip 200.

Figure 20:
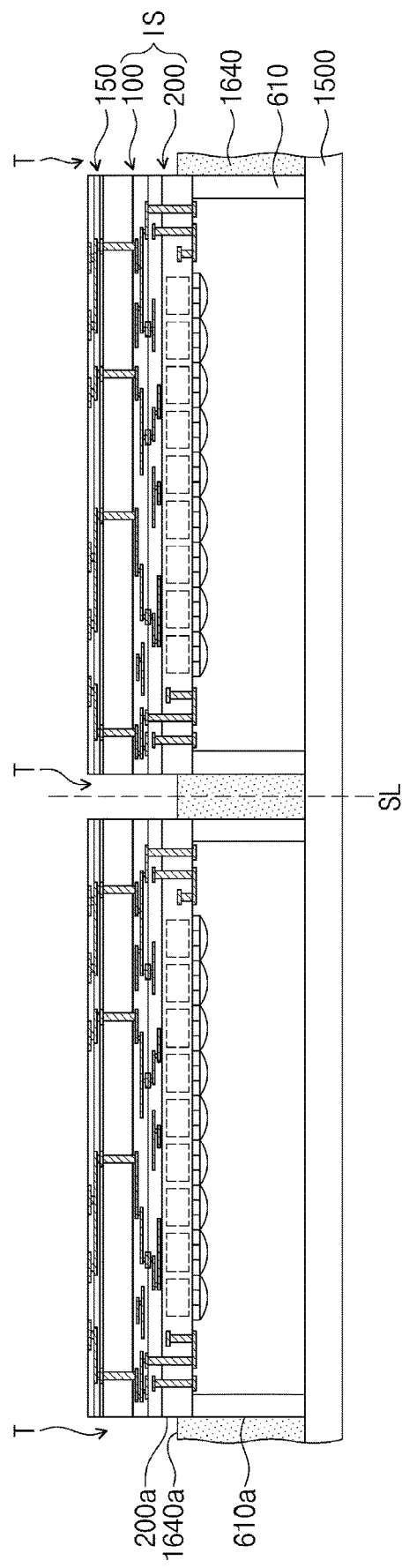

Referring to FIG. 20, an adhesive member 1640 may be formed on the transparent substrate 1500. For example, the adhesive member 1640 may be formed by filling an adhesive material into the trench T that is a space between the supporters 610. The adhesive material may include an adhesive polymer, a non-conductive paste (NCP), an instant adhesive, a thermosetting adhesive, a laser-curable adhesive, or an ultrasonic-curable adhesive. The filling of the adhesive material may continue until a top surface 1640a of the adhesive member 1640 reaches the lateral surface 200a of the second semiconductor chip 200. For example, the top surface 1640a of the adhesive member 1640 may be located between top and bottom surfaces of the second semiconductor chip 200. After the trench T is filled with the adhesive material, a curing process may be performed on the adhesive material, if necessary.

Afterwards, the adhesive member 1640 and the transparent substrate 1500 may be cut into spacers (see the spacer 600 of FIG. 7) and transparent members (see the transparent member 500 of FIG. 7). For example, the transparent substrate 1500 and the adhesive member 1640 may undergo a singulation process performed along a sawing line SL. Thus, the adhesive member 1640 and the transparent substrate 1500 may be diced into semiconductor packages that are divided from each other.

Referring back to FIG. 7, external terminals 156 may be provided on a bottom surface of a redistribution layer 150 of each image sensor part IS. As such, a semiconductor package may be fabricated as shown in FIG. 7.

According to some example embodiments, a semiconductor package may be configured such that a transparent member is rigidly supported on a semiconductor chip. In addition, because a supporter has a low thermal expansion coefficient, the supporter may be less deformed due to heat generated from fabrication processes or produced during the operation of the semiconductor package. As a result, the semiconductor package may increase in thermal stability.

In addition, because not only adhesive patterns but also an additional adhesive layer is used to attach a spacer to the transparent member and the semiconductor chip, the semiconductor package may have increased structural stability. Moreover, the spacer may be attached not only to a top surface of the semiconductor chip but also to a lateral surface of the semiconductor chip, and thus the spacer may be more rigidly attached to the semiconductor chip.

Furthermore, a small width of the supporter may cause incident light from the transparent member to have small amounts of reflection, flare, scattering, and absorption at the supporter. As a result, the semiconductor package may have increased optical sensitivity.

Although example embodiments have been described with reference to the accompanying drawings, it will be understood by one of ordinary skill in the art that variations in form and detail may be made therein without departing from the spirit and essential feature of the present disclosure. The above disclosed example embodiments should thus be considered illustrative and not restrictive.

What is claimed is:

1. A semiconductor package, comprising: a semiconductor chip that comprises a plurality of photoelectric conversion elements on an active array region of the semiconductor chip; a transparent member on the semiconductor chip; and a spacer between the semiconductor chip and the transparent member, and horizontally spaced apart from the active array region, wherein the spacer comprises: a supporter that extends from a top surface of the semiconductor chip toward a bottom surface of the transparent member, wherein the supporter comprises a top surface and a bottom surface that both extend from a first lateral surface of the supporter to a second lateral surface of the supporter; a first adhesive pattern that is between the semiconductor chip and a bottom surface of the supporter, and extends, along the bottom surface of the supporter, from the first lateral surface of the supporter to the second lateral surface of the supporter; and a second adhesive pattern that is between the transparent member and a top surface of the supporter, wherein the spacer protrudes outwardly from a lateral surface of the semiconductor chip, and wherein a lateral surface of the spacer is offset from the lateral surface of the semiconductor chip.

2. The semiconductor package of claim 1, wherein a modulus of the supporter is greater than a modulus of the semiconductor chip.

3. The semiconductor package of claim 1, wherein the lateral surface of the spacer is aligned with a lateral surface of the transparent member.

4. The semiconductor package of claim 1, wherein the spacer protrudes outwardly from a lateral surface of the transparent member, and
wherein the lateral surface of the spacer is offset from the lateral surface of the transparent member.

5. The semiconductor package of claim 1, wherein the spacer defines an inner space between the semiconductor chip and the transparent member.

6. The semiconductor package of claim 5, wherein, when viewed in plan, the spacer has an annular shape that surrounds the active array region.

7. The semiconductor package of claim 1, wherein the semiconductor chip comprises:
   a semiconductor layer that comprises the plurality of photoelectric conversion elements;
   a plurality of color filters on a top surface of the semiconductor layer and arranged to correspond to the plurality of photoelectric conversion elements;

a plurality of micro-lenses on the color filters;
a through electrode that vertically penetrates the semiconductor layer and is electrically connected to at least one of the plurality of photoelectric conversion elements; and
a lower pad on a bottom surface of the semiconductor layer and electrically connected to the through electrode.

8. The semiconductor package of claim 7, further comprising any one or any combination of a logic chip and a memory chip that are electrically connected, via the through electrode, to at least one of the plurality of photoelectric conversion elements.

9. The semiconductor package of claim 1, wherein the spacer further comprises an additional adhesive layer,
wherein the additional adhesive layer contacts the first lateral surface of the supporter, the lateral surface of the semiconductor chip and the bottom surface of the transparent member, and
wherein a lateral surface of the additional adhesive layer is aligned with a lateral surface of the transparent member.

10. A semiconductor package, comprising:
a semiconductor chip that comprises a plurality of photoelectric conversion elements on an active array region of the semiconductor chip;
a transparent member on the semiconductor chip; and
a spacer between the semiconductor chip and the transparent member, and horizontally spaced apart from the active array region,
wherein the spacer comprises:
a supporter that extends from a top surface of the semiconductor chip toward a bottom surface of the transparent member; and
an adhesive layer on a lateral surface of the supporter,
wherein a first end of the adhesive layer extends from the lateral surface of the supporter to contact a lateral surface of the semiconductor chip,
wherein a second end of the adhesive layer contacts the bottom surface of the transparent member, the second end being opposite to the first end, and
wherein the spacer protrudes outwardly from the lateral surface of the semiconductor chip, and
wherein a lateral surface of the spacer is offset from the lateral surface of the semiconductor chip.

11. The semiconductor package of claim 10, wherein the first end of the adhesive layer is at a level lower that is between a level of the top surface of the semiconductor chip and a level of a bottom surface of the semiconductor chip.

12. The semiconductor package of claim 10, wherein a lateral surface of the adhesive layer is aligned with a lateral surface of the transparent member.

13. The semiconductor package of claim 10, wherein the first end of the adhesive layer is in contact with the top surface of the semiconductor chip.

14. The semiconductor package of claim 10, wherein an interval between the semiconductor chip and the transparent member is in a range of about 300 μM to about 500 μM, and wherein a width of the supporter is in a range of about 50 μM to about 200 μM.

15. The semiconductor package of claim 10, wherein, when viewed in plan, the spacer has an annular shape that surrounds the active array region.

16. The semiconductor package of claim 10, wherein the spacer further comprises:
a first additional adhesive pattern between the semiconductor chip and a bottom surface of the supporter; and
a second additional adhesive pattern between the transparent member and a top surface of the supporter.

17. A semiconductor package, comprising:
a first semiconductor chip;
a second semiconductor chip on the first semiconductor chip, the second semiconductor chip comprising a through electrode and a plurality of photoelectric conversion elements;
a plurality of color filters on a top surface of the second semiconductor chip and arranged to correspond to the plurality of photoelectric conversion elements;
a plurality of micro-lenses on the color filters;
a transparent member spaced apart from the top surface of the second semiconductor chip; and
a spacer that connects the second semiconductor chip to the transparent member,
wherein the spacer comprises:
a supporter along an outer edge of the second semiconductor chip, the supporter surrounding the plurality of micro-lenses;
a first adhesive pattern between the supporter and the second semiconductor chip; and
a second adhesive pattern between the supporter and the transparent member,
wherein a lateral surface of the spacer is spaced apart from a lateral surface of the second semiconductor chip, and
wherein a modulus of the supporter is greater than a modulus of the second semiconductor chip.

18. The semiconductor package of claim 17, wherein the spacer protrudes outwardly from the lateral surface of the second semiconductor chip, and
wherein the lateral surface of the spacer is offset from the lateral surface of the second semiconductor chip.

19. The semiconductor package of claim 17, wherein the lateral surface of the spacer is aligned with a lateral surface of the transparent member.

20. The semiconductor package of claim 17, wherein the first semiconductor chip is electrically connected, via the through electrode, to at least one of the plurality of photoelectric conversion elements, and
wherein the first semiconductor chip comprises any one or any combination of a memory chip and a logic chip.

* * * * *